(12) United States Patent
Tabara et al.

(10) Patent No.: US 7,242,095 B2
(45) Date of Patent: Jul. 10, 2007

(54) SEMICONDUCTOR DEVICE HAVING A DUMMY PATTERN

(75) Inventors: Katsuji Tabara, Kawasaki (JP); Seiji Makino, Kawasaki (JP); Takahisa Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 161 days.

(21) Appl. No.: 11/062,489

(22) Filed: Feb. 23, 2005

(65) Prior Publication Data

US 2005/0173802 A1    Aug. 11, 2005

Related U.S. Application Data

(63) Continuation of application No. PCT/JP03/03028, filed on Mar. 13, 2003.

(51) Int. Cl.
*H01L 23/48* (2006.01)
*H01L 23/52* (2006.01)
*H01L 29/40* (2006.01)

(52) U.S. Cl. .................................. 257/758; 257/797
(58) Field of Classification Search ................ 257/758, 257/797
See application file for complete search history.

(56) References Cited

U.S. PATENT DOCUMENTS

| | | | | |
|---|---|---|---|---|
| 6,060,786 A * | 5/2000 | Wang | | 257/797 |
| 6,133,585 A | 10/2000 | Murata | | |
| 6,314,543 B1 | 11/2001 | Yamaguchi | | |
| 6,486,565 B2 * | 11/2002 | Miyako | | 257/797 |
| 6,664,642 B2 * | 12/2003 | Koubuchi et al. | | 257/776 |
| 6,730,931 B2 * | 5/2004 | Cleeves et al. | | 257/48 |

FOREIGN PATENT DOCUMENTS

| | | |
|---|---|---|
| JP | 62-36821 | 2/1987 |
| JP | 9-306910 | 11/1997 |
| JP | 2003-133418 | 5/2003 |
| JP | 2003-142583 | 5/2003 |

* cited by examiner

*Primary Examiner*—Howard Weiss
(74) *Attorney, Agent, or Firm*—Westerman, Hattori, Daniels & Adrian, LLP.

(57) ABSTRACT

A semiconductor device includes a substrate, a circuit pattern formed on the substrate, and a plurality of dummy patterns formed on the substrate in addition to the circuit pattern, wherein the plurality of dummy patterns include a plurality of marker dummy patterns in an array thereof, the marker dummy patterns being distinguishable from other dummy patterns and are distributed irregularly in the array of the dummy patterns.

10 Claims, 12 Drawing Sheets

PRIOR ART

FIG.3 PRIOR ART
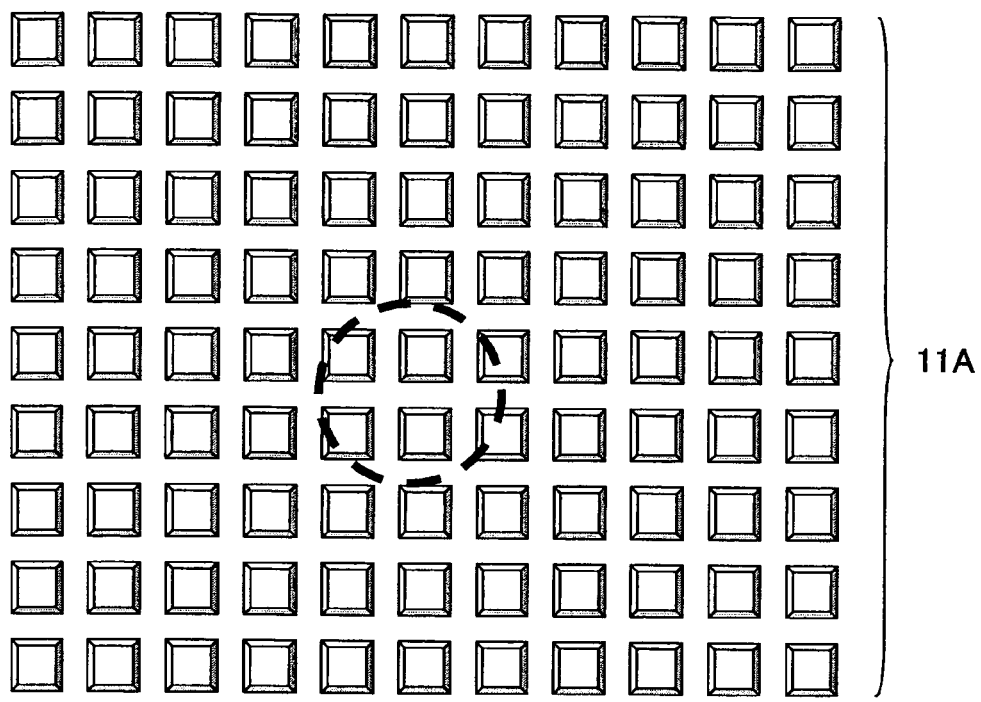
11A
FIG.4 PRIOR ART
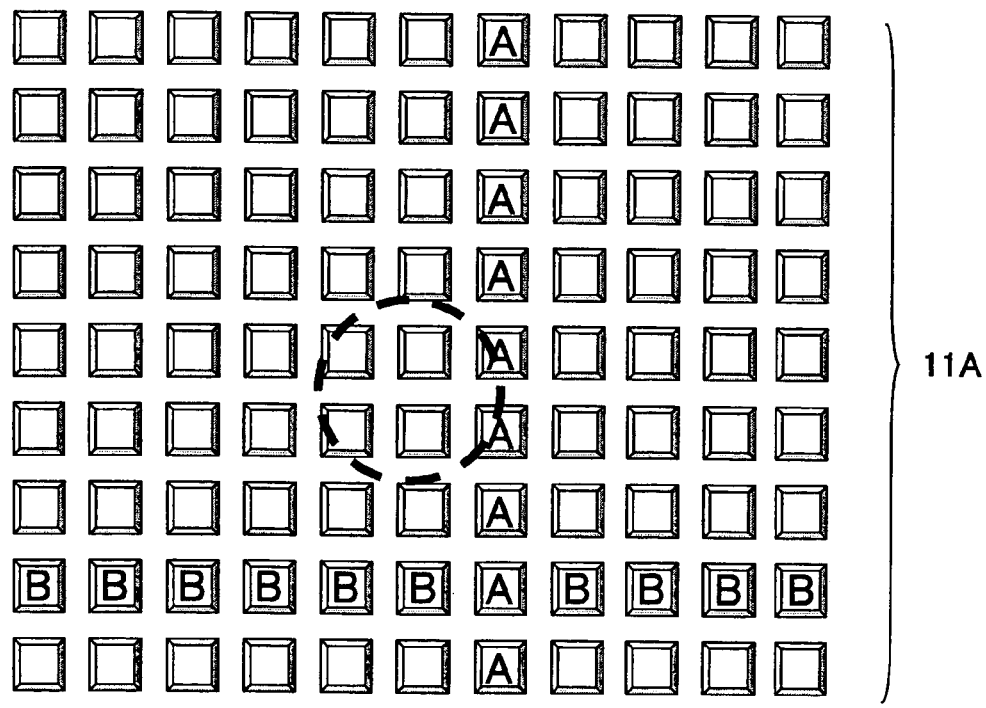
11A

PRIOR ART

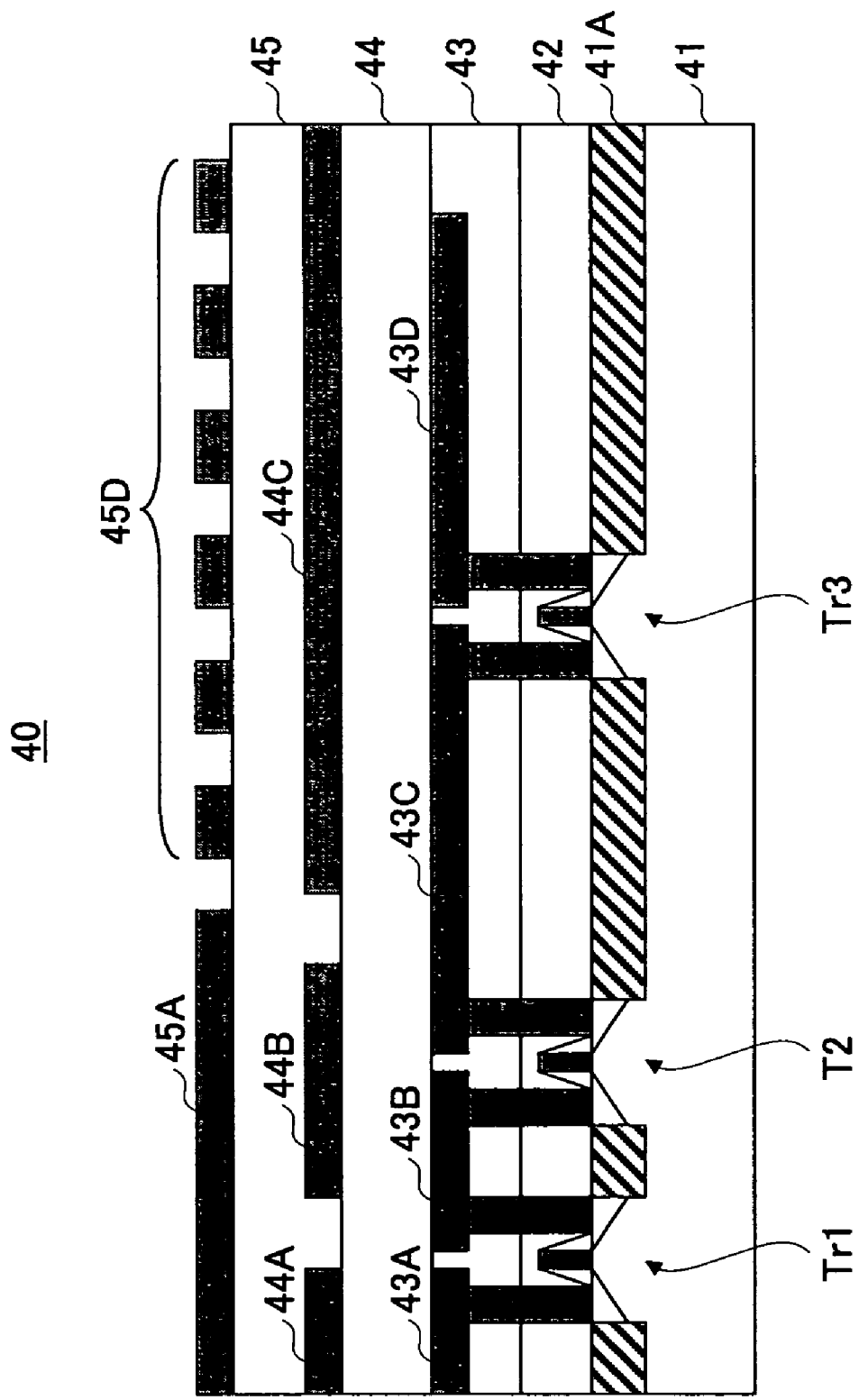

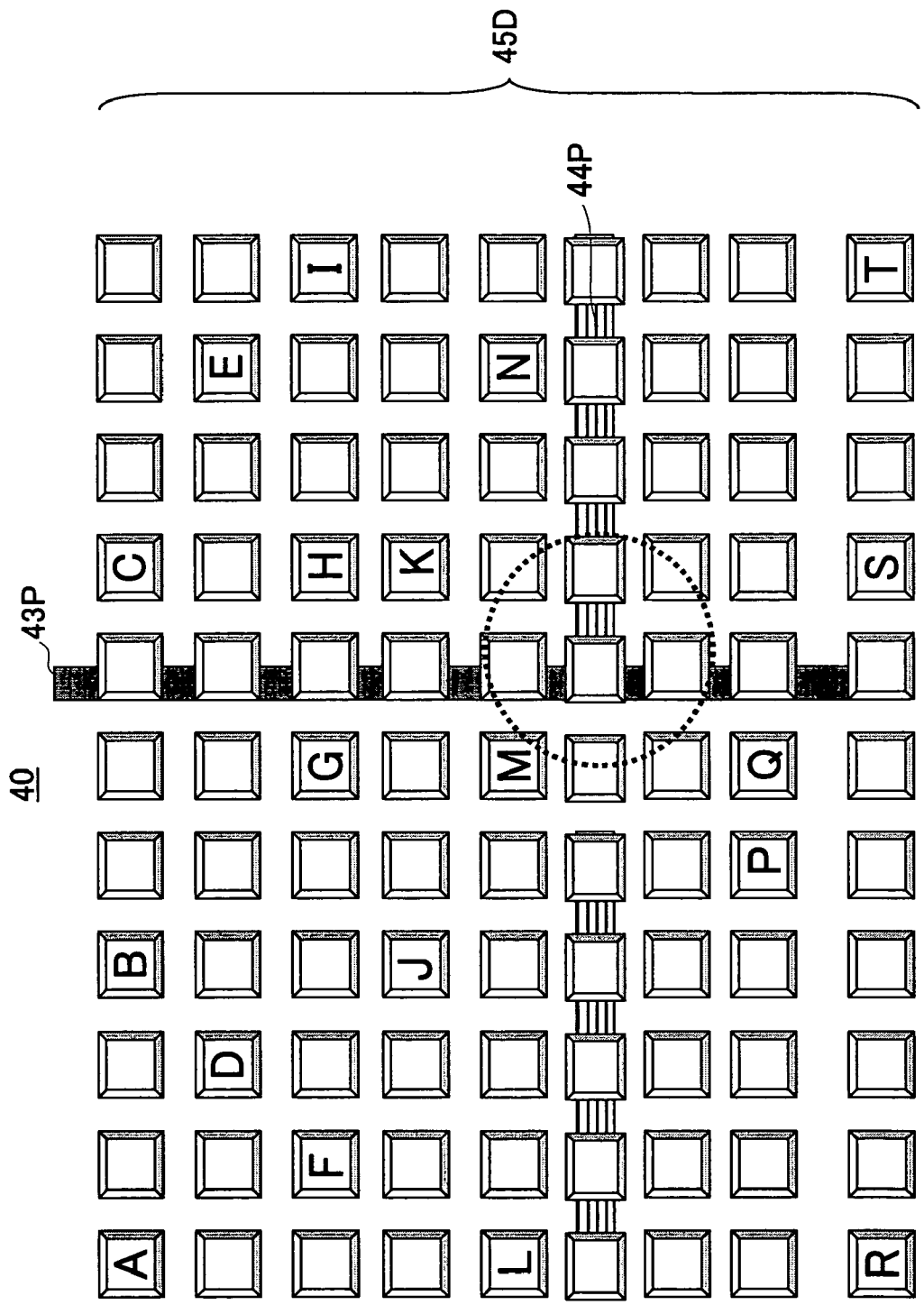

SEMICONDUCTOR DEVICE HAVING A DUMMY PATTERN

CROSS-REFERENCE TO RELATED APPLICATIONS

The present invention is a continuation application filed under 35 U.S.C.111(a) claiming benefit under 35 U.S.C.120 and 365(c) of PCT application PCT/JP2003/03028 filed on Mar. 13, 2003, the entire contents of which are incorporated herein as reference.

BACKGROUND OF THE INVENTION

The present invention generally relates to semiconductor devices and more particularly to a semiconductor device having a dummy pattern.

In semiconductor integrated circuit devices, it is generally practiced to provide a multilayer interconnection structure on a substrate formed with minute active devices, for interconnecting these active devices electrically.

A multilayer interconnection structure is formed of lamination of interlayer insulation films, wherein each of the interlayer insulation film is embedded with a corresponding interconnection pattern. Further, the interconnection patterns of different interlayer insulation films are connected with each other via via-holes formed in the interlayer insulation films to form a desired circuit.

In modern ultrafine semiconductor devices, there are formed huge number of active devices on the substrate as a result of increased integration density, and because of this, there are formed extremely complex interconnection patterns in the multilayer interconnection structure in many layers.

Thus, at the time of fabricating such a semiconductor integrated circuit having extremely complex interconnection patterns, it is generally inevitable that there occur some defects in the multilayer interconnection structure due to the failure of layout or defective fabrication process.

Thus, in order to produce such semiconductor integrated circuits of large integration density with high yield, it is essential to analyze the semiconductor integrated circuits that turned out to be defective.

Conventionally, analysis of the defective semiconductor integrated circuit device has been achieved by using an optical microscope such as a laser microscope having a large focal depth for detection of the interconnection patterns embedded in the multilayer interconnection structure. On the other hand, for the purpose of repair of defective parts, which may include formation of contact holes, disconnection of interconnection pattern, formation of contact pads for testing, or the like, it has been practiced to use a FIB (focused-ion-beam) processing apparatus or a scanning electron microscope that includes therein such FIB processing apparatus.

Thus, conventionally, it has been practiced to locate the defects in the multilayer interconnection by means of an optical microscope and conduct various repair works at that location by the FIB processing apparatus, such as formation of contact holes, disconnection of the interconnection patterns, formation of test contact pads, in correspondence to the defects thus detected. Here, it should be noted that an optical microscope can observe the lower interconnection patterns embedded in the multilayer interconnection structure, while an FIB processing apparatus or scanning electron microscopes can only observe the pattern shape at the outermost surface.

Meanwhile, in the semiconductor integrated circuit that uses a multilayer interconnection structure, it is practiced to secure planar surface for the interlayer insulation films by forming, in each of the interlayer insulation films, dummy patterns in correspondence to the regions where the interconnection patterns are sparsely distributed.

Thus, it has been practiced conventionally that, in the event a defect has been detected by the microscopic observation, the distribution of the dummy patterns in the vicinity of the detected defect is acquired at the same time. Thereby, the FIB processing apparatus identifies the location of the defect that has been detected by the optical microscope based on the distribution of the dummy patterns thus acquired and applies the necessary repair work at this location.

Further, Japanese Laid-Open Patent Application 9-306910 describes the technology of forming a specific dummy pattern that can be used as a mark in the dummy patterns with a uniform interval for facilitating the identification of the defect location by the FIB apparatus.

According to the technology disclosed in the foregoing Japanese Laid-Open Patent Application 9-306910, it becomes possible to locate the predetermined defect easily by using the FIB processing apparatus by carrying out a search while using such marks as the reference.

FIG. 1 shows the state of the interconnection pattern in a multilayer interconnection structure obtained by a laser microscope.

Referring to FIG. 1, it becomes possible to observe, as a result of use of the laser microscope, not only the uppermost interconnection pattern 11 in the multilayer interconnection structure but also the interconnection pattern 12 provided underneath the interconnection pattern 11. Thereby, it becomes possible to detect the disconnection or short circuit in the multilayer interconnection structure carrying out the circuit analysis operation based on the microscopic observation. Further, it can be seen that there is formed a large number of dummy patterns 11A in the multilayer interconnection structure at the same level as the uppermost interconnection pattern 11.

Contrary to this, FIG. 2 shows the pattern obtained for the case the surface of the same multilayer interconnection structure is observed by an FIB processing apparatus.

Referring to FIG. 2, it can be seen that, while the uppermost interconnection pattern 11 and the dummy patterns 11A are observable in this case, it is not possible to observe the interconnection pattern 12 underneath the interconnection pattern 11.

Now, in the case the dummy patterns 11A are distributed at random as shown in FIGS. 1 and 2, it is not difficult to identify the processing region circled in FIG. 1 in the FIB image of FIG. 2 from the distribution of the dummy patterns 11A.

However, in advanced ultrafine semiconductor integrated circuits, there occurs increase of density of the interconnection patterns with increase of the integration density, and associated therewith, there occurs an increase in the density of the dummy patterns that are formed in the region in which the interconnection patterns are formed sparsely. As a result of this, there arises a situation in which the dummy patterns 11A are repeated regularly as represented in FIG. 3.

It should be noted that, in the situation in which the dummy patterns 11A are repeated regularly as shown in FIG. 3, it is difficult to locate the region circled in the drawing, in which the repair work should be made, from the arrangement of the dummy patterns 11A.

In order to identify a particular region for repair work, it is necessary to acquire the distribution of the dummy patterns 11A over a wide area, while search of such a wide area takes time, and the production cost of the semiconductor device is increased inevitably.

On the other hand, the foregoing Japanese Laid-Open Patent Application 9-306910 describes the technology enabling identification of the desired location of repair work, by dummy patterns represented as "A" or "B" in FIG. 4, regularly in the arrangement of the dummy patterns 11A for the purpose of mark. The dummy pattern that can be used for such a purpose of the mark can be formed by changing the shape or material thereof with regard to those of other dummy patterns.

In the case of identifying the location of the repair work based on the regularly repeated dummy patterns as shown in FIG. 4, it is true that the identification of location of the repair work can be made easily and quickly in the case the site of the repair work is located in the vicinity of the intersection of the array of the dummy patterns A repeated in the vertical direction and the array of the dummy patterns B repeated in the horizontal direction, while in the case the desired site of repair work is located in the area remote from such an intersection, it becomes necessary to search the intersection over a wide area, and the same situation explained with reference to FIG. 3 arises.

Further, when such arrays of dummy patterns A and B are formed on the substrate in large number for avoiding such a problem, the difficulty of locating the site of repair work cannot be avoided, as long as these arrays are formed regularly with a predetermined interval. Further, there is no guarantee that such dummy patterns A or B used for the mark can be formed repeatedly and regularly on a substrate.

(Reference 1) Japanese Laid-Open Patent Application 9-306910

SUMMARY OF THE INVENTION

Accordingly, it is a general object to provide a novel and useful semiconductor device wherein the foregoing problems are eliminated.

Another and more specific object of the present invention is to provide a semiconductor device in which location for the repair work is easily identified by using a surface observation apparatus such as a focused-ion-beam processing apparatus or a scanning electron microscope that acquires an image of a surface.

Another object of the present invention is to provide a semiconductor device comprising:

a substrate;

a circuit pattern formed on said substrate; and a plurality of dummy patterns formed on said substrate in addition to said circuit pattern, wherein said plurality of dummy patterns include a plurality of marker dummy patterns in an array thereof, said marker dummy patterns being distinguishable from other dummy patterns and are distributed irregularly in said array of said dummy patterns.

According to the present invention, it becomes possible to identify a current location or the location of the site in which a repair work is needed, easily and quickly, by observing a limited region of the substrate while using the foregoing marker dummy patterns distinguishable over other dummy patterns and distributed irregularly as a mark.

Other objects and further features of the present invention will become apparent from the following detailed description when read in conjunction with the attached drawings.

BRIEF DESCRIPTION OF THE DRAWINGS

FIG. 3 is a diagram explaining the problems of conventional technology;

FIG. 4 is a diagram explaining another conventional technology for eliminating the problem of FIG. 3 and the problems arising with such another technology;

FIG. 6 is a cross-sectional diagram showing the construction of a semiconductor device according to a first embodiment of the present invention;

FIG. 7 is a plan view diagram showing a multilayer interconnection structure used with the semiconductor device of FIG. 6;

DETAILED DESCRIPTION OF THE INVENTION

First Embodiment

Figure 1:
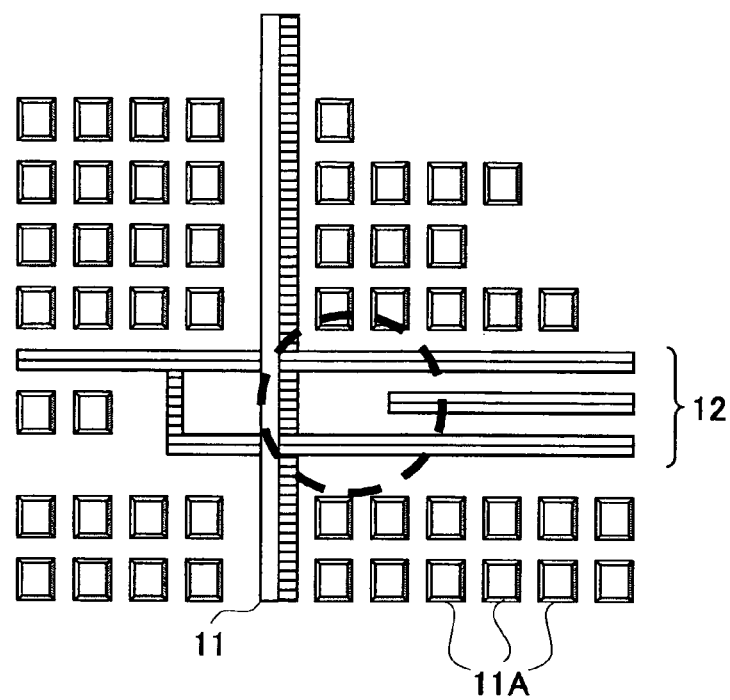
FIG. 1 is a diagram showing an image acquired for a surface of a conventional semiconductor device for the case the surface is observed by a laser microscope.
Figure 2:
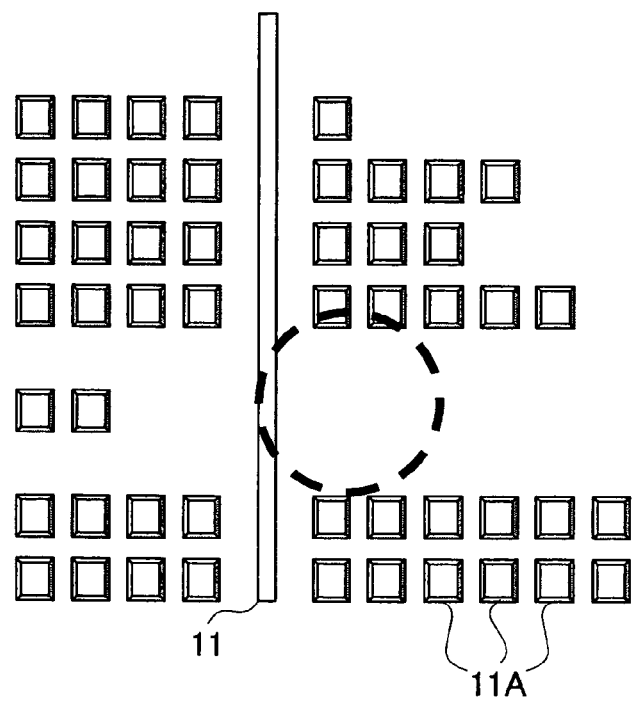
FIG. 2 is a diagram showing an image acquired for the surface of the conventional semiconductor device of FIG. 1 for the case the surface is observed by an FIB processing apparatus.
Figure 5:
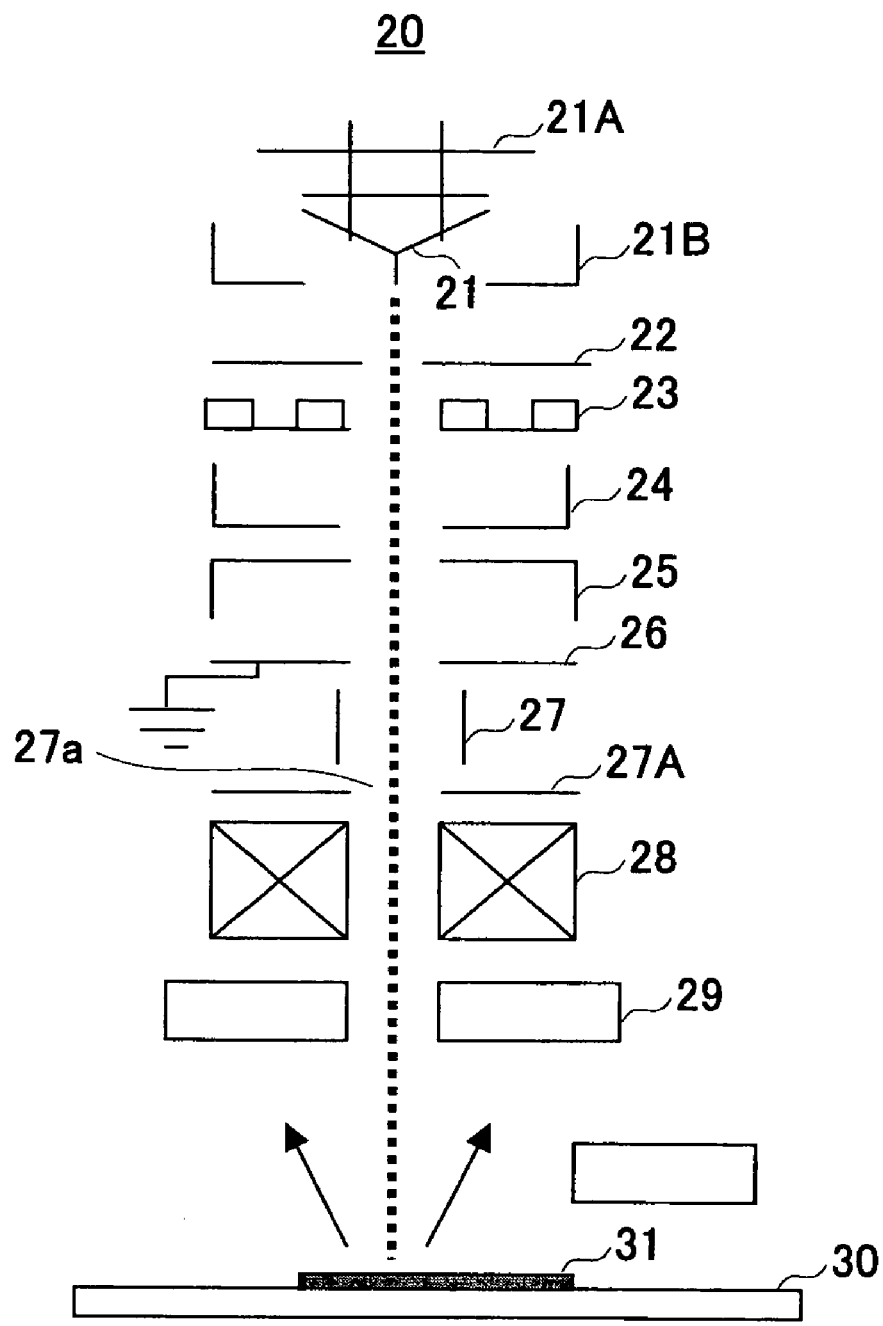
FIG. 5 is a diagram showing the construction of a conventional FIB processing apparatus.

FIG. 5 shows the construction of an FIB apparatus 20 used in the present invention schematically.

Referring to FIG. 5, the FIB processing apparatus 20 includes a filament 21 of Ga, or the like, held on a movable base 21A, and Ga ions are emitted from the filament 21 toward a substrate 31 to be processed on a stage 30, by applying a high voltage to an anode 22.

The Ga ions thus emitted are shaped by an aperture plate 23 and an ion beam is formed as a result. The ion beam thus formed is focused upon the substrate 31 to be processed on the stage 30 by lenses 24-26. Thereby, the ion beam is turned on and off by applying a control voltage to a blanking electrode 27 and is moved over the surface of the substrate 31 to be processed to a desired location by driving a deflector 28.

Further, the foregoing FIB processing apparatus 20 is provided with a detector 29 that detects secondary electrons or secondary ions emitted from the surface of the substrate 31 to be processed upon collision of the ions in the ion beam. Thus, the foregoing detector constitutes a scanning ion microscope or scanning electron microscope integrated with the FIB processing apparatus 20.

Further, on the optical axis of the foregoing ion beam, there are provided a suppressor 21B for adjusting the beam current and a blanking plate 27A provided with a blanking aperture 27a, wherein the blanking plate 27A achieves the foregoing on-off control of the ion beam in cooperation with the blanking electrode 27.

FIG. 6 shows the construction of a semiconductor integrated circuit 40 according to the first embodiment of the present invention and processed with the FIB apparatus 20 of FIG. 5 in a cross-sectional view.

Referring to FIG. 6, the semiconductor integrated circuit 40 includes a large number of MOS transistors Tr1, Tr2, Tr3, . . . formed on a silicon substrate 41 with device isolation achieved by a device isolation region 41A of STI structure, or the like, wherein the transistors Tr1-Tr3 are covered with an interlayer insulation film 42 formed on the substrate 41.

On the interlayer insulation film 42, there is provided a next interlayer insulation film 43, and interconnection patterns 43A-43D are embedded in the interlayer insulation film 43. Further, the interconnection patterns 43A-43D achieve a contact with the diffusion regions of the respective, corresponding MOS transistors via respective contact plugs.

On the interlayer insulation film 43, there is further provided a next interlayer insulation film 44, and next interconnection patterns 44A-44C are formed on the interlayer insulation film 44.

Further, there is provided a next interlayer insulation film 45 on the interlayer insulation film 44 so as to cover the interconnection patterns 44A-44C, wherein the interlayer insulation film 45 carries thereon a next interconnection pattern 45A and a large number of dummy patterns 45D.

It should be noted that the dummy patterns 45D are formed on the region of the interlayer insulation film 45 in which the interconnection pattern 45A is not existing for facilitating the planarization of the next interlayer insulation film (not shown) to be formed on the interlayer insulation film 45.

FIG. 7 shows an image acquired with the semiconductor device 40 of FIG. 6 for the case the surface of the interlayer insulation film 45 is observed by a laser microscope.

Referring to FIG. 7, it can be seen that there are formed dummy patterns 45D on the surface of the interlayer insulation film 45 with a uniform interval, and underneath the same, it can be seen that there extends a lower interconnection pattern 44P, which may include the interconnection patterns 44A-44C of FIG. 6. Further, with the image of FIG. 7, it can be seen that a further lower pattern 43P, including the interconnection patterns 43A-43D of FIG. 6, extends underneath the interconnection pattern 44P.

Figure 8C:
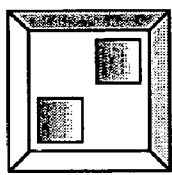
FIGS. 8A-8H are diagrams showing examples of the dummy patterns and mark patterns used with the first embodiment of the present invention.
Figure 8B:
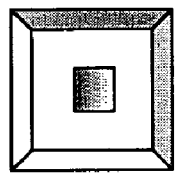
Figure 8A:
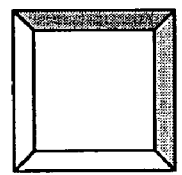
Figure 8E:
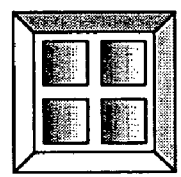
Figure 8D:
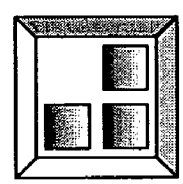

In the present embodiment, the foregoing dummy patterns 45D include, in addition to the ordinary dummy pattern of square shape having the size of 0.3-0.5 μm for each edge as shown in FIG. 8A, other marker dummy patterns A-T of various shapes or compositions as shown in FIGS. 8B-8H, wherein these marker dummy patterns A-T are formed so as to distribute irregularly in the array of the dummy patterns 45D, at least in the visual field of the FIB processing apparatus at the time of the repair work, which may be the area of typically 24 μm×24 μm.

Figure 8H:
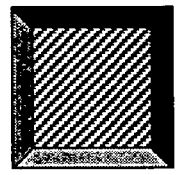
Figure 8G:
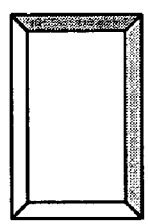
Figure 8F:
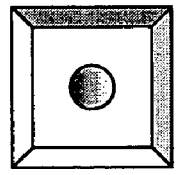

Referring to FIGS. 8B-8H, it can be seen that the marker dummy patterns of FIGS. 8B-8E are formed by forming one or more depressions in the dummy pattern of FIG. 8A, while the marker dummy pattern of FIG. 8F is formed by changing the shape of the depression. Further, the marker dummy pattern of FIG. 8G is formed by changing the shape of the dummy pattern itself, while the marker dummy pattern of FIG. 8H changes the composition of the dummy pattern.

Thus, with the examples of FIGS. 8B-8G, the recognition of the marker dummy pattern is achieved by recognizing the shape of the dummy pattern obtained by the secondary ion detector 29 of the FIB processing apparatus of FIG. 5, while the recognition of the marker dummy patter of FIG. 8H is achieved based on the reflectivity of the secondary electrons or secondary ions.

Figure 9:
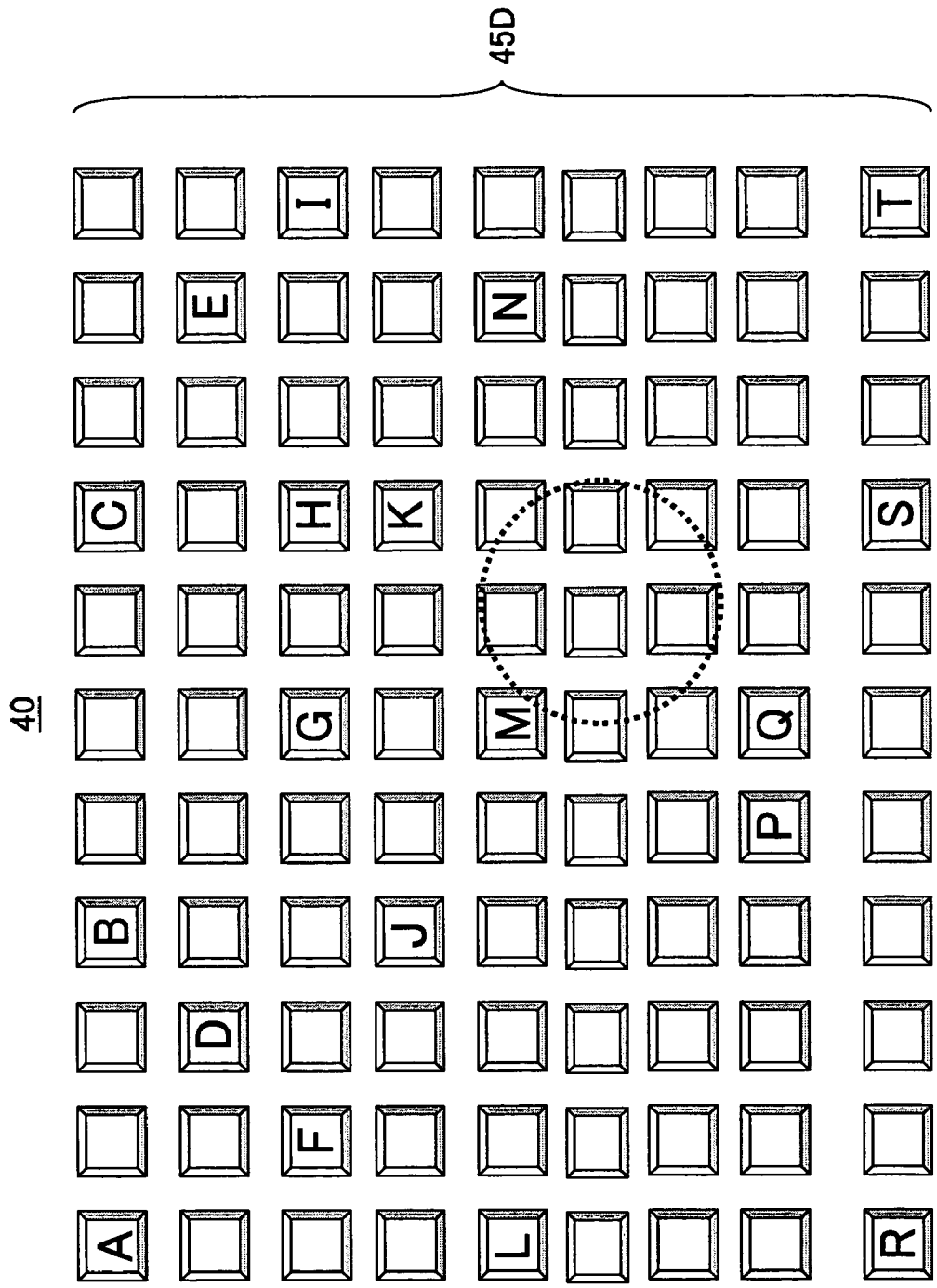
FIGS. 9-10 are further diagrams explaining the first embodiment of the present invention.

Thus, with the case in which the structure of FIG. 7 is observed by the FIB processing apparatus, it is possible to recognize the marker dummy patterns A-T by way of the scanning ion microscope of the FIB processing apparatus, and thus, the site of the repair work circled in FIG. 7 becomes recognizable based on the distribution of the mark dummy patterns A-T as shown in FIG. 9.

Figure 10:
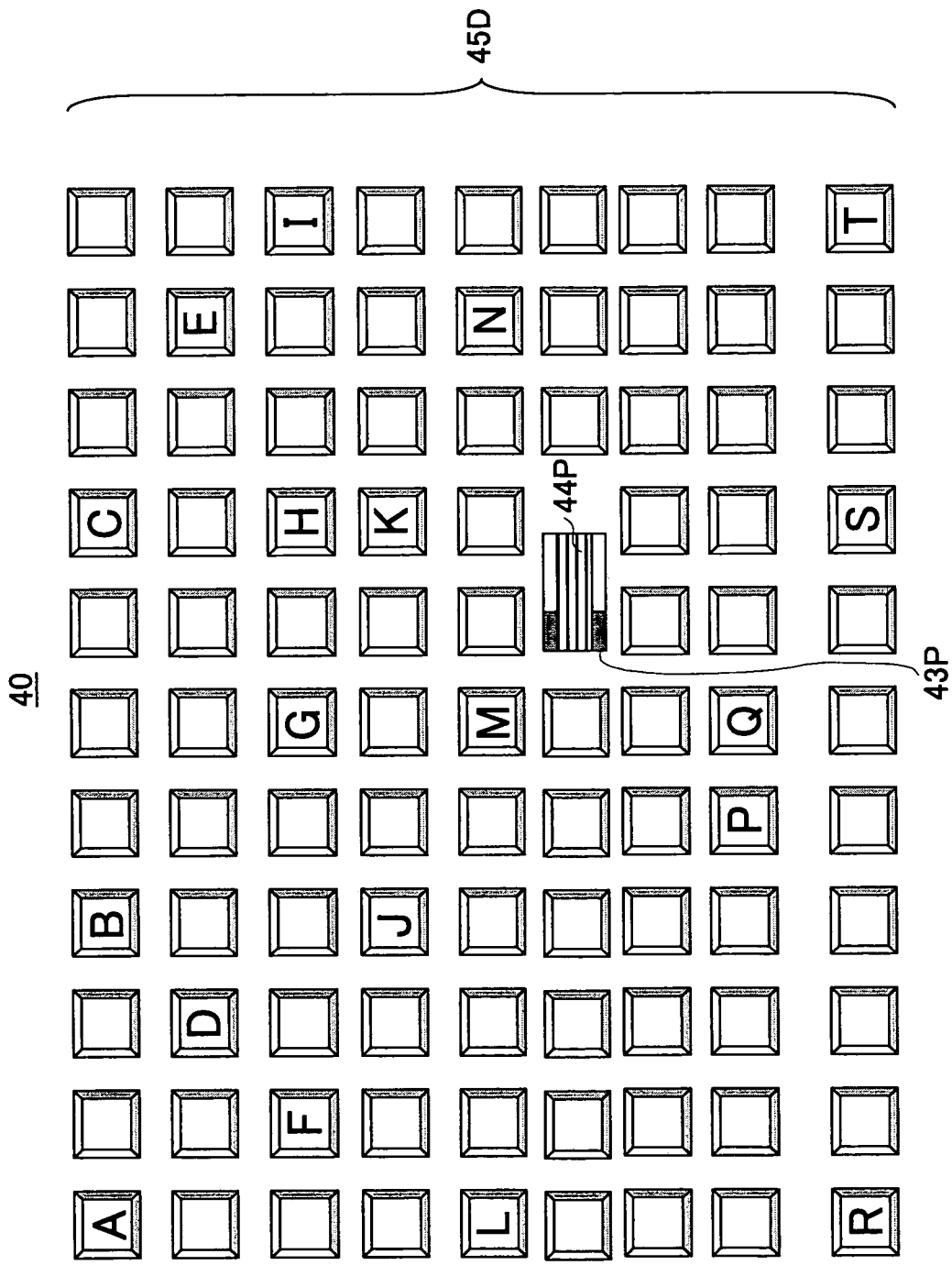

Thus, by removing the dummy pattern 45 and the underling interlayer insulation film at the site of the repair work by the FIB processing as shown in FIG. 10, it becomes possible to perform a repair work, which may be the one that exposes the underlying interconnection pattern 44P or 43P, solely based on the scanning ion microscope image of the FIB processing apparatus.

Meanwhile, in order to identify the location of the site where the repair work should be made solely based on the secondary ion image as in the case of FIG. 10, it is necessary to provide a map of the marker dummy patterns A-T in advance.

Figure 11:
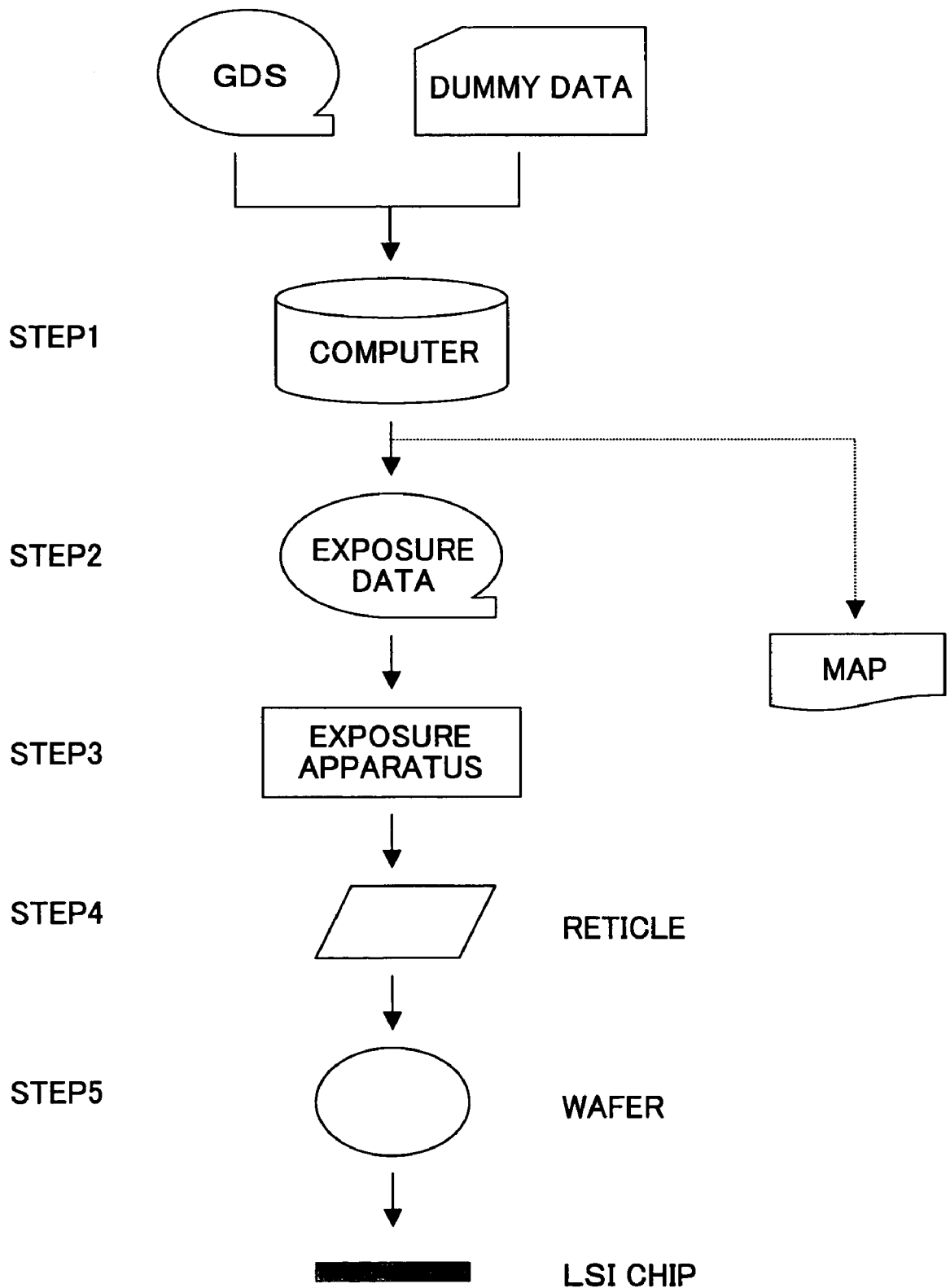
FIG. 11 is a flowchart showing a repair work of a semiconductor integrated circuit device conducted by the FIB processing apparatus of FIG. 5 while using the marker patterns of the present embodiment.

FIG. 11 shows an example of such preparation process of the map.

Referring to FIG. 11, the device pattern data GDS of the semiconductor integrated circuit and the dummy pattern data are merged in a computer in the step 1, and the exposure data of the semiconductor integrated circuit device including the marker dummy patterns A-T is creased in the step 2, such that the marker dummy patterns are distributed irregularly in the dummy patterns 45D. It should be noted that the distribution of the dummy patterns 45D and the distribution of the marker dummy patterns A-T are determined at the time of this merging process of the step 1. With this, map data representing the distribution of the mark dummy patterns in the dummy patterns is determined.

In the process of FIG. 11, the exposure data is supplied to an exposure apparatus in the step 3, and formation of reticle is made in the step 4. Further, exposure of a wafer is achieved in the step 5 while using the reticle thus formed, and with this, the desired chip of the semiconductor integrated circuit is obtained.

It should be noted that identification of the location of the repair work can be thus achieved by referring to the map of the mark dummy patterns A-T obtained by the step 2.

After the step of FIG. 10, the interconnection pattern 44P or 43P thus exposed are disconnected by the FIB processing apparatus as necessary. Alternatively, a contact hole may be formed so as to connect the interconnection pattern 44P and the interconnection pattern 43P. Further, it is possible to provide a pad electrode eclectically conducting to any of these.

Second Embodiment

As explained before, it is possible with the present invention to use a mark dummy pattern in which the composition of the dummy pattern is changed.

For example, in the case the interconnection pattern and the dummy pattern are formed of Al, it is possible to form the marker dummy patterns by Cu.

Alternatively, in the case the interconnection patterns and the dummy patterns are formed of Cu, it is possible to form the marker dummy patterns by Al. Of course, combination of other materials is also possible.

Figure 12:
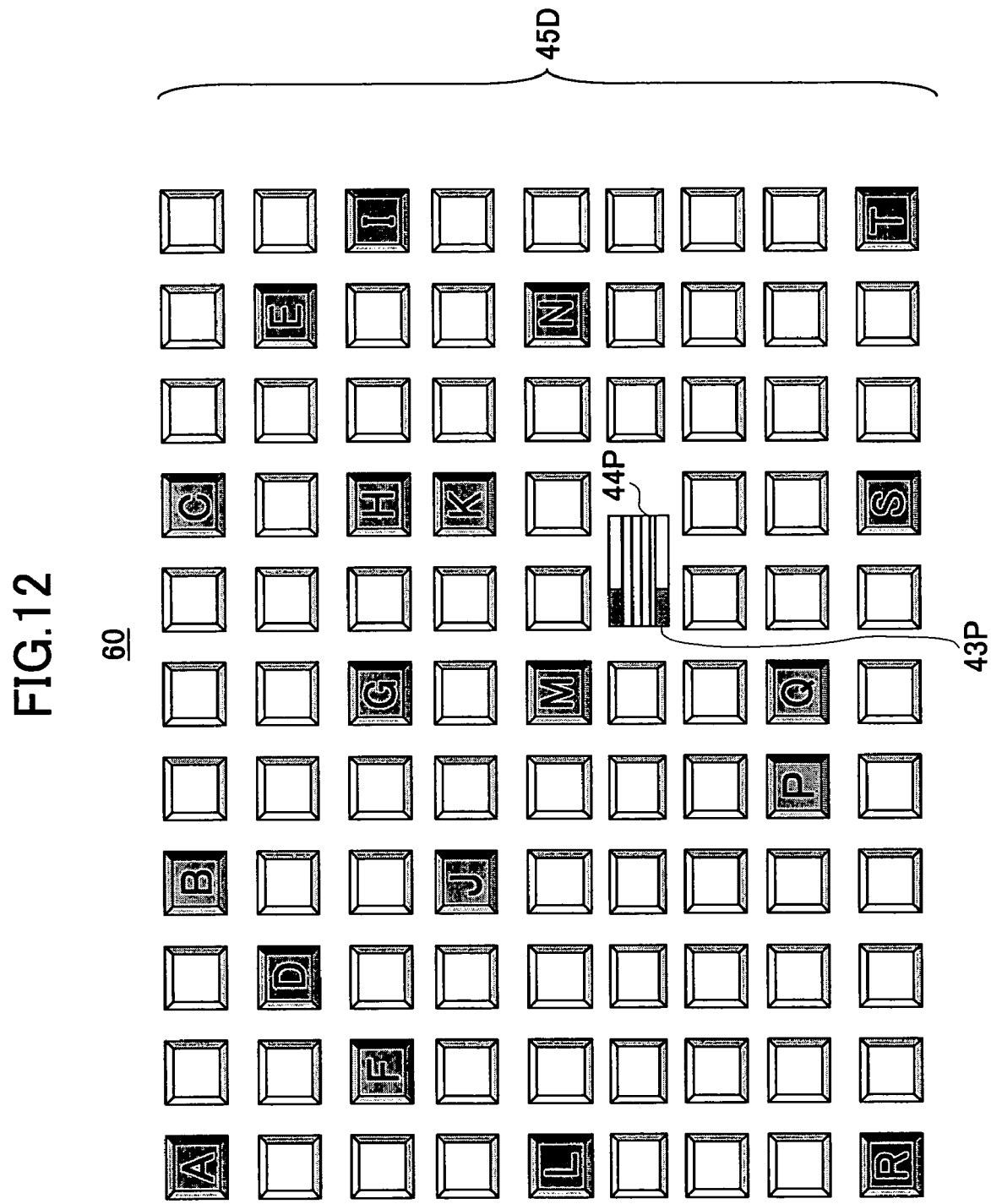
FIGS. 12-14 are plan view diagrams showing the construction of a semiconductor device of the second embodiment.

FIG. 12 shows the construction of a semiconductor integrated circuit device 60 according to a second embodiment of the present invention that uses the dummy patterns A-T of modified compositions.

Referring to FIG. 12, the distribution of the patterns A-T is acquired in the form of map by means of the scanning ion microscope of the FIB processing apparatus while utilizing the difference of reflectivity of the marker dummy patterns A-T over other dummy patterns 45D. Thereby, the current location and the location of the site for the repair work are identified by referring to the foregoing map.

Figure 13:
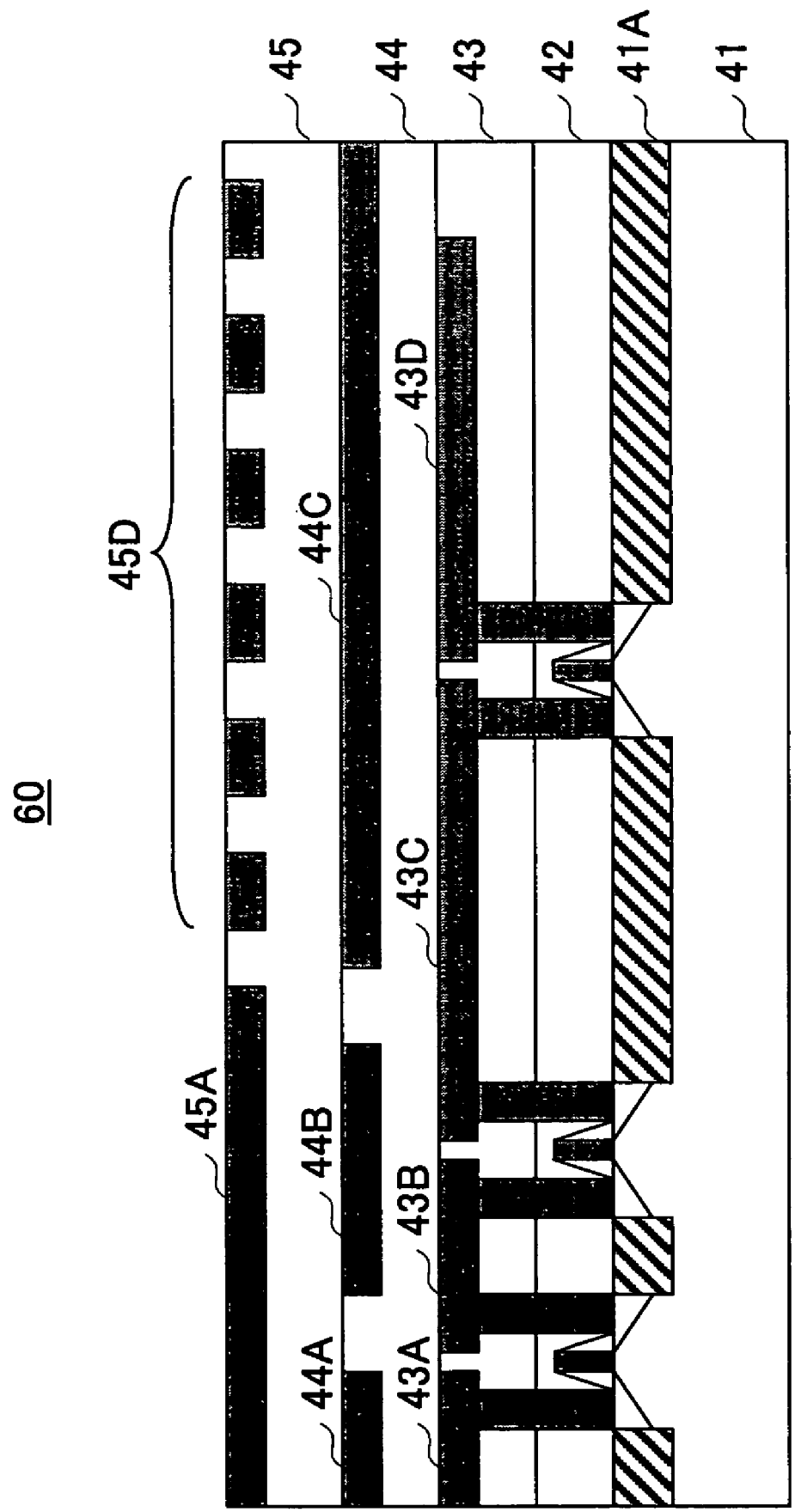
Figure 14:
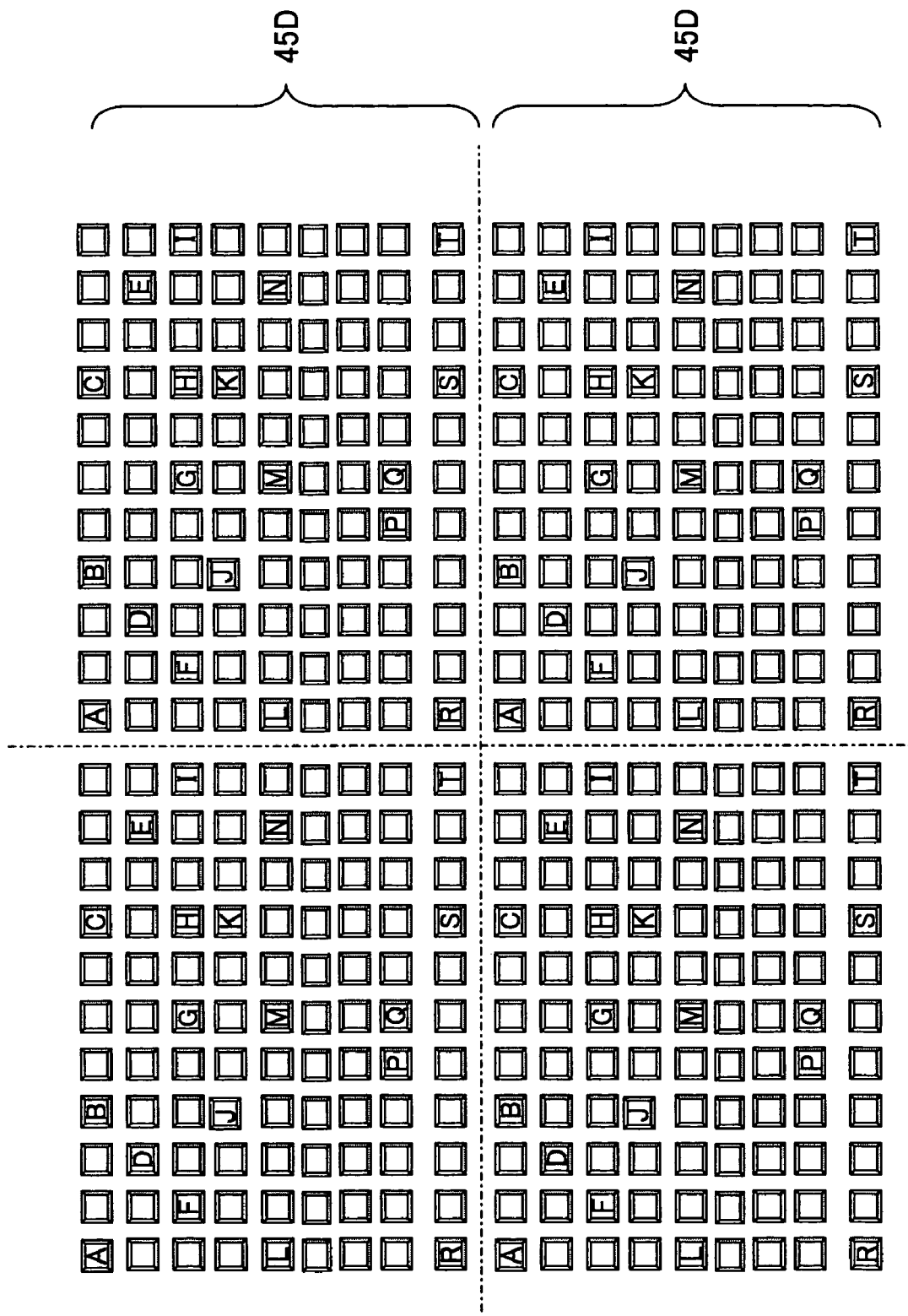

Because the marker dummy patterns A-T of the present embodiment has a flat surface, the present embodiment is particularly suited for the fabrication of the semiconductor integrated circuit device that has the multilayer interconnection structure formed by a damascene process and a CMP process such as the one having a cross-sectional structure shown in FIG. 13. In FIG. 13, it should be noted that those parts corresponding to the parts explained previously are designated by the same reference numerals and the description thereof will be omitted.

In the structure of FIG. 13, it should be noted that the interconnection patterns 44A-44C or 45A and the dummy patterns 45D are formed by the damascene process, in which grooves are formed first in the interlayer insulation film and the grooves thus formed are filled subsequently by a conductor layer, followed by removing the excess conductor layer remaining on the surface of the interlayer insulation film by a CMP process. Thus, the cross-section of FIG. 13 shows the feature characteristic to the damascene process in which the surfaces of the interconnection patterns 44A-44C are coincident with the surface of the interlayer insulation film 44 and that the surfaces of the interconnection patterns 45A and the dummy patterns 45D are coincident with the surface of the interlayer insulation film 45.

Here, it should be noted that similar advantage is obtained also in the case of using mark patterns having a flat surface but different shape as shown in FIG. 8G. Thereby, it should be noted that such a mark pattern of modified shape is by no means limited to the one shown in FIG. 8G, but patterns of various shapes such as cross-shape, circular shape, triangular shape, and the like, can be used.

Further, it should be noted that the irregular distribution of the mark dummy patterns A-T is required only in the visual field of the scanning ion microscope at the time of the focused-ion-beam processing, typically having the size of 24×24 μm, and there is no need of providing irregular distribution over the entire wafer.

Thus, it is possible to repeat the distribution of the mark dummy patterns A-T of FIG. 9 in every unit area having the size of 24×24 μm. By using such a construction, it becomes possible to reduce the computational load in the merging step 1 of FIG. 11.

Further, the present invention is not limited to the embodiments described heretofore, but various variations and modifications may be made without departing from the scope of the invention.

According to the present invention, it becomes possible to identify a current location or the location of the site in which a repair work is needed, easily and quickly, by observing a limited region of the substrate while using the foregoing marker dummy patterns distinguishable over other dummy patterns and distributed irregularly as a mark.

What is claimed is:

1. A semiconductor device comprising:
    a substrate;
    a circuit pattern formed on said substrate; and
    a plurality of dummy patterns formed on said substrate in addition to said circuit pattern,
    wherein said plurality of dummy patterns include a plurality of marker dummy patterns in an array thereof, said marker dummy patterns being distinguishable from other dummy patterns and are distributed irregularly in said array of said dummy patterns.

2. The semiconductor device as claimed in claim 1, wherein said circuit pattern, said dummy patterns and said marker dummy patterns are formed on a common interlayer insulation film.

3. The semiconductor device as claimed in claim 1, wherein said marker dummy pattern has a surface shape different from said dummy patterns.

4. The semiconductor device as claimed in claim 3, wherein said marker dummy pattern carries one or more depressions on a surface thereof.

5. The semiconductor device as claimed in claim 1, wherein said marker dummy pattern has a planar shape different from said dummy patterns.

6. The semiconductor device as claimed in claim 1, wherein said marker dummy pattern has a composition different from said dummy patterns.

7. The semiconductor device as claimed in claim 1, wherein said circuit pattern, said dummy patterns and said marker dummy patterns are formed in a common interlayer insulation film such that respective surfaces are coincident with a surface of said interlayer insulation film.

8. The semiconductor device as claimed in claim 1, wherein said plural dummy patterns are formed regularly.

9. The semiconductor device as claimed in claim 1, wherein each of said marker dummy patterns has a height substantially identical with each of said plural dummy patterns.

10. The semiconductor device as claimed in claim 1, wherein said circuit pattern, said dummy patterns and said marker dummy patterns are formed in a multilayer interconnection structure formed on said substrate.

* * * * *